(12) United States Patent
Strasser et al.

(10) Patent No.: US 11,733,266 B2
(45) Date of Patent: Aug. 22, 2023

(54) PROBE CABLE ASSEMBLY AND METHOD (71) Applicant: Rohde & Schwarz GmbH & Co. KG, Munich (DE)

(72) Inventors: Franz Strasser, Niclasreuth (DE); Andreas Ziegler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 89 days.

(21) Appl. No.: 17/382,147

(22) Filed: Jul. 21, 2021

(65) Prior Publication Data
US 2023/0024181 A1 Jan. 26, 2023

(51) Int. Cl.

| | | |
|---|---|---|
| *G01R 1/04* | (2006.01) | |
| *G01R 1/067* | (2006.01) | |
| *G01R 1/073* | (2006.01) | |
| *A61B 8/14* | (2006.01) | |
| *A61B 5/00* | (2006.01) | |
| *A61B 5/05* | (2021.01) | |
| *A61B 5/06* | (2006.01) | |
| *G01R 1/18* | (2006.01) | |
| *H01F 7/02* | (2006.01) | |
| *H01B 7/04* | (2006.01) | |
| *H01B 11/18* | (2006.01) | |

(52) U.S. Cl.
CPC ..... *G01R 1/06705* (2013.01); *G01R 1/06772* (2013.01); *G01R 1/18* (2013.01); *H01B 7/04* (2013.01); *H01B 11/1895* (2013.01); *H01F 7/02* (2013.01)

(58) Field of Classification Search
CPC . G01R 1/02; G01R 1/04; G01R 1/067; G01R 1/073; G01R 1/18; A61B 8/14; A61B 5/00; A61B 5/05; A61B 5/06
See application file for complete search history.

(56) References Cited

U.S. PATENT DOCUMENTS

| | | | |
|---|---|---|---|
| 10,302,676 B2 | 5/2019 | Mende et al. | |
| 2006/0095066 A1* | 5/2006 | Chang | A61M 25/10 606/199 |
| 2017/0271826 A1* | 9/2017 | Mende | H01R 24/40 |
| 2018/0116551 A1* | 5/2018 | Newman | A61B 5/05 |
| 2018/0228557 A1* | 8/2018 | Darisse | A61B 1/000094 |

\* cited by examiner

*Primary Examiner* — Neel D Shah
(74) *Attorney, Agent, or Firm* — Patterson + Sheridan LLP (57) ABSTRACT

The present disclosure provides a probe cable assembly comprising a probe interface configured to couple to a measurement interface and to receive a differential signal, a measurement output interface configured to output the differential signal, and a cable arrangement electrically arranged between the probe interface and the measurement output interface and configured to conduct the differential signal between the probe interface and the measurement output interface, the cable arrangement comprising a cable, a plurality of magnetic elements arranged around at least a section of the length of the cable, wherein each magnetic element is separated by a gap from adjacent magnetic elements, and a plastically deformable guiding element configured to fix the cable arrangement with a predetermined relative position between the probe interface and the measurement output interface.

20 Claims, 7 Drawing Sheets

PROBE CABLE ASSEMBLY AND METHOD

TECHNICAL FIELD

The present disclosure relates to a probe cable assembly and to a method for manufacturing a probe cable assembly.

BACKGROUND

Although applicable to any measurement system, the present disclosure will mainly be described in conjunction with oscilloscopes.

In modern electronics development the measurement of high speed signals, especially differential signals, is a common task.

Different measurement devices like oscilloscopes are available to measure differential signals in a device under test (DUT). A possible interface for connecting a measurement device to a DUT may be provided by using a pair of pins or wires and soldering these pins or wires to respective test points on the DUT. The pins or wires may then be connected to the measurement device via a cable. However, ambient electric fields may interact with such a cable, which in some cases may lack sufficient shielding. Such interference may cause interference with the signals that are to be measured.

Document U.S. Pat. No. 10,302,676 B2 discloses a flexible resistive tip cable assembly for differential probing with magnetic elements that are provided around the cable to shield the cable from common mode interference. The flexible nature of the cable assembly allows forming the cable assembly to position the measurement tip at the DUT. However the flexible nature of the cable assembly will also result in restoring forces that act to remove the measurement tip from the intended position.

Accordingly, there is a need for providing an improved measurement cable assembly.

SUMMARY

The above stated problem is solved by the features of the independent claims. It is understood, that independent claims of a claim category may be formed in analogy to the dependent claims of another claim category.

Accordingly, it is provided:

A probe cable assembly comprising a probe interface configured to couple to a measurement interface, for example a measurement probe, and to receive a differential signal, a measurement output interface configured to output the differential signal, and a cable arrangement electrically arranged between the probe interface and the measurement output interface and configured to conduct the differential signal between the probe interface and the measurement output interface, the cable arrangement comprising a cable, a plurality of magnetic elements arranged around at least a section of the length of the cable, wherein each magnetic element is separated by a gap from adjacent magnetic elements, and a plastically deformable guiding element configured to fix the cable arrangement with a predetermined relative position between the probe interface and the measurement output interface.

Further, it is provided:

A method for manufacturing a probe cable assembly, the method comprising providing a probe interface configured to couple to a measurement interface, for example a measurement probe, and to receive a differential signal, providing a measurement output interface configured to output the differential signal, and to form a cable arrangement arranging a plurality of magnetic elements around at least a section of the length of a cable, wherein each magnetic element is separated by a gap from adjacent magnetic elements, and coupling a plastically deformable guiding element configured to fix the cable arrangement with a predetermined relative position between the probe interface and the measurement output interface to the cable; and coupling the cable arrangement electrically between the probe interface and the measurement output interface.

The present disclosure is based on the finding that a flexible cable is difficult to position exactly because the restoring forces exerted by the flexible elements in the cable will deform the cable after it is positioned for example by a user.

The present disclosure therefore provides a probe cable assembly that may be plastically positioned. The term "plastically" in general refers to the property of a material of being shaped irreversibly after surpassing a limit of reversible or flexible deformation. The term "plastically" in the context of the present disclosure refers to the probe cable assembly generally keeping the shape as adjusted by a user. Of course the term "plastically" may also accommodate very moderate restoring forces that do not return the probe cable assembly to its original shape, or that only deform the probe cable assembly to a very low extent. Such a deformation "to a very low extent" may for example comprise a movement of the probe interface after it is positioned by a user of below 10 mm, 5 mm, 4 mm, 3 mm, 2 mm or 1 mm in any direction. The user may then simply re-position the probe interface by that amount.

The probe cable assembly comprises a probe interface and a measurement output interface. The probe interface serves to couple the probe cable assembly to a measurement interface and to receive a differential signal, i.e. the signal to be measured. The measurement interface may comprise e.g., a measurement probe. Of course, the probe interface may also mechanically couple to the measurement interface.

The measurement interface couples the probe cable assembly to a device under test and may for example comprise a probe tip, a soldered connection, an RF connector, pressure contacts, wires/leads, pins, adapters, interposers, clip-ons, or the like. The probe interface may for example comprise an RF connector, especially a standard type standard-size or miniature-size or micro-size RF connector, a pin header, or any other adequate connector or interface that couples to the measurement interface. A direct connection from the probe interface to the DUT is also possible.

The measurement output interface serves to output the differential signal and to couple the probe cable assembly for example to a measurement device or any other interposed device that may be coupled to the measurement device. Such a measurement device may be e.g., an oscilloscope. Interposed devices may for example comprise measurement amplifiers or the like and may also be called probe box. It is understood, that the present disclosure is meant to also disclose a measurement system comprising a measurement device and the probe cable assembly, or the measurement device, an interposed device, and the probe cable assembly. The measurement output interface may for example comprise a SMA connector or any other type of adequate interface or connector.

Between the probe interface and the measurement output interface the probe cable assembly comprises a cable arrangement that conducts the differential signal between the probe interface and the measurement output interface. The cable arrangement is plastically deformable. This means that the cable arrangement may be arranged in a predetermined shape by a user and will generally maintain that shape. The probe interface may, therefore, be positioned by a user and will stay at the intended position, even if the user takes his hands off the probe interface or the measurement interface that may be coupled to the probe interface.

The cable arrangement comprises a cable. The cable is the element that actually conducts the differential signal between the probe interface and the measurement output interface. To this end, the probe interface and the measurement output interface comprise respective electrical contacts for contacting the conducting elements like e.g., the conductor and the shielding, of the cable.

The cable arrangement further comprises a plurality of magnetic elements that are arranged around the cable on at least a section of the length of the cable. The magnetic elements serve for shielding the cable against common mode interference. In other words, the magnetic elements isolate the differential signal from common mode interference.

The magnetic elements are provided with gaps between pairs of magnetic elements in each case. This means that while the cable is straight, a magnetic element does not come into contact with any adjacent magnetic element. At the same time the gaps allow bending the cable at least to a certain extent without the magnetic elements touching each other, thus preventing friction and possible damage to the magnetic elements.

The cable arrangement further comprises a plastically deformable guiding element for fixing the cable arrangement with a predetermined relative position between the probe interface and the measurement output interface. This plastically deformable guiding element may be bent into any shape and will generally retain the respective shape until being bent into another shape.

Usually, the measurement output interface will be coupled to a fixed counterpart that fixes the measurement output interface in a predetermined position and with a predetermined orientation. This counterpart may for example be the interface of a measurement device, like for example an oscilloscope, or the above-mentioned probe box. Usually, after setting up the measurement laboratory, the position of the measurement device and therefore the measurement output interface will not change during the measurement.

With the plastically deformable guiding element it is, therefore, possible to exactly position the probe interface with any measurement interface that may be provided on the probe interface with respect to a device under test (DUT). After positioning the probe interface, the plastically deformable guiding element will constrain the probe interface in the configured position without any restoring forces removing the probe interface from that position.

With the probe cable assembly according to the present disclosure it is therefore possible to easily set-up a measurement arrangement and to exactly position a measurement probe attached to the probe interface of the probe cable assembly.

Further embodiments of the present disclosure are subject of the further dependent claims and of the following description, referring to the drawings.

In an embodiment, the plastically deformable guiding element may comprise a plastically deformable wire or rod.

In another embodiment, the plastically deformable guiding element may comprise a plurality of stiff sections that are interconnected by joint arrangements.

It is understood, that the plastically deformable guiding element may be provided as any element that may retain a specific shape or form. Therefore, wires or rods of a respective material may be used, like for example copper wires or wires made of other metals.

Alternatively, the plastically deformable guiding element may comprise a plurality of non-deformable or stiff elements or sections that are coupled to each other via joints or hinge-like arrangements, like for example ball joints.

It is understood, that the plastically deformable guiding element may be provided alongside the cable arrangement. Alternatively, the plastically deformable guiding element may be provide such that it couples to the cable arrangement near the probe interface and near the measurement output interface to keep the probe interface in position.

In yet another embodiment, the plastically deformable guiding element may be provided between the cable and the magnetic elements or on the outside of the magnetic elements.

If the plastically deformable guiding element is provided alongside the length of the cable arrangement, the plastically deformable guiding element may be provided directly alongside the cable, especially wound around the cable.

Alternatively, the plastically deformable guiding element may be provided outside of the magnetic elements, especially wound around the magnetic elements.

In a further embodiment, the probe cable assembly may comprise a cover sleeve provided around the magnetic elements. The plastically deformable guiding element may in this embodiment be provided between the cable and the magnetic elements or between the magnetic elements and the cover sleeve or in the cover sleeve or outside the cover sleeve.

The cover sleeve may be provided around the magnetic elements as protective cover for the magnetic elements. Such a cover sleeve may for example be a plastic or rubber material protective sleeve.

The plastically deformable guiding element may be provided alongside the magnetic elements and covered by the cover sleeve. As alternative, the plastically deformable guiding element may be integrated into the cover sleeve. The cover sleeve may for example be molded around the plastically deformable guiding element. As further alternative, the plastically deformable guiding element may be provided on the outside of the cover sleeve, for example wound around the cover sleeve. It is understood, that such a plastically deformable guiding element may be glued or fixed to the cover sleeve by any adequate fixing means. Of course, instead of being "wound around" the cable or other elements, the plastically deformable guiding element may also be provided in parallel to or alongside the cable or other elements.

In an embodiment, the magnetic elements may comprise ferrite elements.

The ferrites or ferrite elements surround the cable and shield the cable from common mode interference. Such ferrite elements operate like a type of common mode chokes around the cable.

In another embodiment, the magnetic elements may be movable along the length of the cable.

The magnetic elements may comprise a circular or round cross sectional area with a round opening in the center. Such magnetic elements form cylinders with an opening in the center. The cable is provided in the round openings. It is understood, that the round openings may have a diameter that is larger than the diameter of the cable. This allows the magnetic elements to move on the cable. Therefore, when a user bends the probe cable assembly the magnetic elements may move along the length of the cable while the user bends the probe cable assembly to allow the probe cable assembly to move into the required shape.

It is understood, that a cover sleeve as indicated above may be provided over the magnetic elements and hold the magnetic elements in position relatively to each other and allow bending movement of the cable arrangement. At the same time the cable may slide in the center openings of the magnetic elements.

In yet another embodiment, the magnetic elements may comprise a conically shaped end on each end in the direction of the cable.

The magnetic elements instead of being purely cylindrically shaped may also comprise conically shaped or tapered ends in the direction of length of the cylinder. Such conically shaped ends allow bending the probe cable assembly without moving the cable in the center of the magnetic elements. Instead, the conically shaped ends allow bending the magnetic elements towards each other until the outer surface of the conically shaped ends come into contact and stop the bending movement. The angle of the surfaces of the conically shaped ends determines the maximum bending angle.

It is understood, that cylindrical magnetic elements and magnetic elements with conically shaped ends may be combined in a probe cable assembly as fits the respective application.

In a further embodiment, the cable arrangement may comprise a low friction spacer arranged in at least one of the gaps.

The low friction spacer may comprise a non-flexible or rigid material and protect the surfaces of the magnetic elements when they come into contact with each other. It is understood, that the term "non-flexible" or "rigid" in this case may refer to a material that under normal usage conditions, i.e. bending of the probe cable assembly by a user, would be perceived by the user as non-flexible or rigid. Of course, if excessive force is used, such a material may still deform, but with regard to this disclosure may be seen as a non-flexible or rigid material.

It is understood, that low friction spacers may be provided in a plurality of gaps or in all gaps, as adequate for the respective application.

In an embodiment, the low friction spacers may comprise Polytetrafluoroethylene material.

Polytetrafluoroethylene or PTFE is a thermoplastic polymer that maintains high strength, toughness and self-lubrication. PTFE also comprises a very low coefficient of friction and may therefore serve as a kind of washer between the magnetic elements.

In another embodiment, the cable may comprise a coaxial cable comprising a signal conductor configured to conduct a signal of the differential signal, an insulator surrounding the signal conductor, and a reference conductor surrounding the insulator and configured to conduct a reference signal of the differential signal.

The cable may be a standard coaxial cable as it may be used in measurement applications for transmitting signals to be transmitted. Such cables usually comprise a signal conductor surrounded by an insulator that is surrounded by the reference conductor or mesh. Finally, a sleeve usually covers the reference conductor or mesh.

In yet another embodiment, the signal conductor may comprise a heatsealing band alloy, especially a NiCr alloy.

The signal conductor, instead of comprising a standard conductor like for example a copper wire, may also comprise a wire made of heatsealing band alloy or any other metallic alloy that comprises a high electrical resistance value compared to e.g., copper.

Using a signal conductor with a high resistance value, like wires made of NiCr or other heatsealing band alloys, reduces the reflections caused in the cable, which is especially advantageous when measuring low power RF signals.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
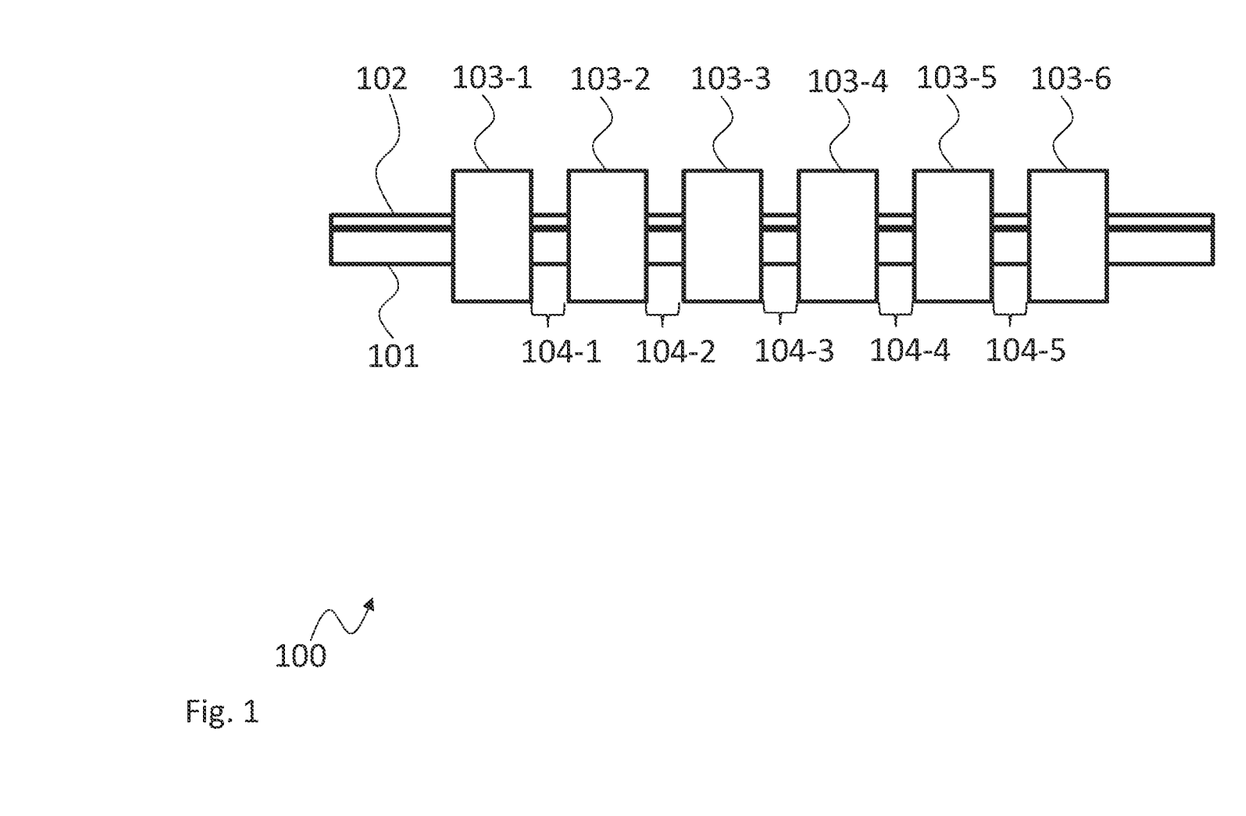
FIG. 1 shows a schematic view of an embodiment of a cable arrangement according to the present disclosure.

FIG. 1 shows a section of a cable arrangement 100 in a side view. The cable arrangement 100 comprises a cable 101 and a plastically deformable guiding element 102 that carry a number of magnetic elements 103-1-103-6.

The cable 101 and the plastically deformable guiding element 102 are arranged alongside each other. It is understood, that in other embodiments, the plastically deformable guiding element 102 may for example be wound around the cable 101 or around the magnetic elements 103-1-103-6.

The cable arrangement 100 comprises six exemplary magnetic elements 103-1-103-6. It is understood, that the number of six magnetic elements 103-1-103-6 is just exemplarily chosen and that any other number of magnetic elements 103-1-103-6 may be provided. It is further understood, that the magnetic elements 103-1-103-6 may be provided over the full length of cable 101 or only on predetermined sections of the cable 101. As can be seen for example in FIG. 5, a cover sleeve may optionally be provided that surrounds the magnetic elements 103-1-103-6. Such a cover sleeve may also serve to hold the magnetic elements 103-1-103-6 in position relative to each other or on the cable 101. Of course such a cover sleeve may comprise rubber like or flexible material that allows bending the cover sleeve.

The cable 101 may comprise a standard coaxial cable. Such cables usually comprise a signal conductor configured to conduct a signal of a differential signal, an insulator surrounding the signal conductor, and a reference conductor surrounding the insulator and configured to conduct a reference signal of the differential signal. A sleeve or cover usually surrounds the reference conductor. It is understood, that any other type of cable may also be used in the probe cable assembly according to the present invention. The cable may for example also serve for conducting non-differential signals. It is understood, that the probe interface and the measurement output interface may then be adapted accordingly.

The plastically deformable guiding element 102 may comprise a metal wire or rod or strap that may be deformed by a user bending the probe cable assembly into a desired shape or position, like for example a copper wire or rod or strap.

The magnetic elements 103-1-103-6 are distributed over the length of the shown section of the cable 101. Each one of the magnetic elements 103-1-103-6 is separated from adjacent magnetic elements 103-1-103-6 by a gap 104-1-104-5. The gaps 104-1-104-5 serve as buffer zone and allow bending the cable arrangement 100, at least to a certain extent, without the single magnetic elements 103-1-103-6 touching each other. As indicated above, the magnetic elements 103-1-103-6 may be held in position relatively to each other by a cover sleeve.

In such an embodiment, the cable 101 and the plastically deformable guiding element 102 may be arrange movable in the magnetic elements 103-1-103-6. For example, in a front view the magnetic elements 103-1-103-6 may comprise a round outer shape with an opining in the center. The opening in the center may be larger than the cable 101 and the plastically deformable guiding element 102 and thus allow a sliding movement of the cable 101 and the plastically deformable guiding element 102 through the openings of the magnetic elements 103-1-103-6.

When the cable arrangement 100 is bent by a user the cable 101 and the plastically deformable guiding element 102 will therefore automatically slide into the required position without dragging on or sticking to the magnetic elements 103-1-103-6. Easy positioning of the cable arrangement 100 is therefore possible.

It is understood, that the size of the gaps 104-1-104-5 may be chosen according to an intended bending radius for the cable arrangement 100. The bending radius is defined by the radius at which the magnetic elements 103-1-103-6 come into contact. Therefore, the larger that gaps 104-1-104-5 are chosen, the smaller the minimum bending radius will be. On the other side, with increasing size of the gaps 104-1-104-5, the shielding effect provided by the magnetic elements 103-1-103-6 may be reduced. The exact size of the gaps 104-1-104-5 may therefore be chosen according to an application's specific requirements.

Further, the length and the diameter of the single magnetic elements 103-1-103-6 may be the same for all magnetic elements 103-1-103-6. Alternatively, the magnetic elements 103-1-103-6 used for a cable arrangement 100 may comprise different lengths and different diameters.

For example, magnetic elements 103-1-103-6 at the ends of the cable arrangement 100 may be chosen to be longer or thicker i.e., comprise a larger diameter, than magnetic elements 103-1-103-6 in the center section of the cable arrangement 100. Such an arrangement allows providing an increased shielding on the ends of the cable arrangement 100 and increasing the bendability in the center section of the cable arrangement 100.

Figure 2:
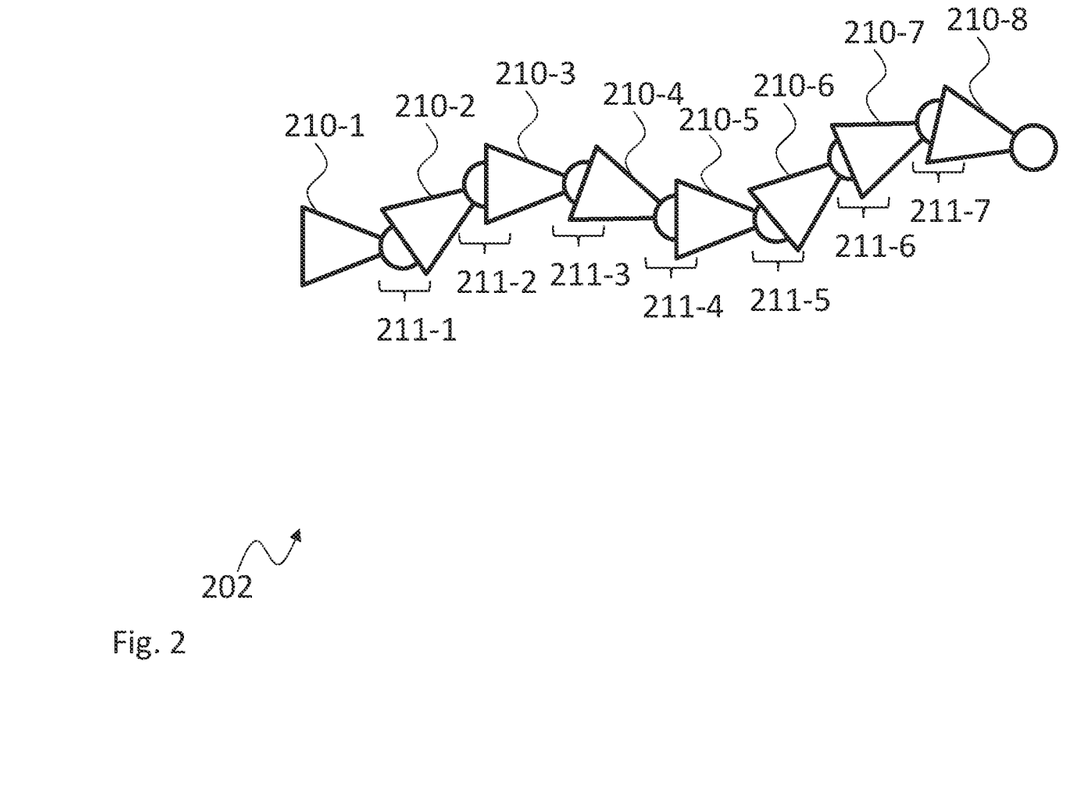
FIG. 2 shows a schematic view of an embodiment of a plastically deformable guiding element according to the present disclosure.

FIG. 2 shows a plastically deformable guiding element 202. The plastically deformable guiding element 202 may be used with any of the embodiments of a cable arrangement or probe cable assembly shown in the present disclosure, especially in addition to or instead of the wire, rod or strap indicated above with regard to FIG. 1.

The plastically deformable guiding element 202 comprises a plurality of stiff section 210-1-210-8 that are coupled to each other by a joint-like or hinge-like arrangement 211-1-211-7. The joint-like arrangements 211-1-211-7 of the plastically deformable guiding element 202 are provided as ball-joints that allow rotating or bending two adjacent stiff sections 210-1-210-8 in any direction with regard to each other, until the maximum rotation angle of the joint-like arrangement 211-1-211-7 is reached. A sequence of such stiff sections 210-1-210-8 and joint-like arrangements 211-1-211-7 may therefore, as well as a e.g., a copper wire, be bent into an arbitrary shape by a user.

The force needed to bend the plastically deformable guiding element 202 and the maximum retaining force exerted by the plastically deformable guiding element 202 may be configured by specifically designing the joint-like arrangements 211-1-211-7 to incorporate the desired holding force.

It is understood, that other types of joint-like arrangements instead of ball-joints may also be used. For example, two joints with a fixed movement axis may be used in each case for a joint-like arrangement with the movement axes rotated by 90° to each other.

Figure 3:
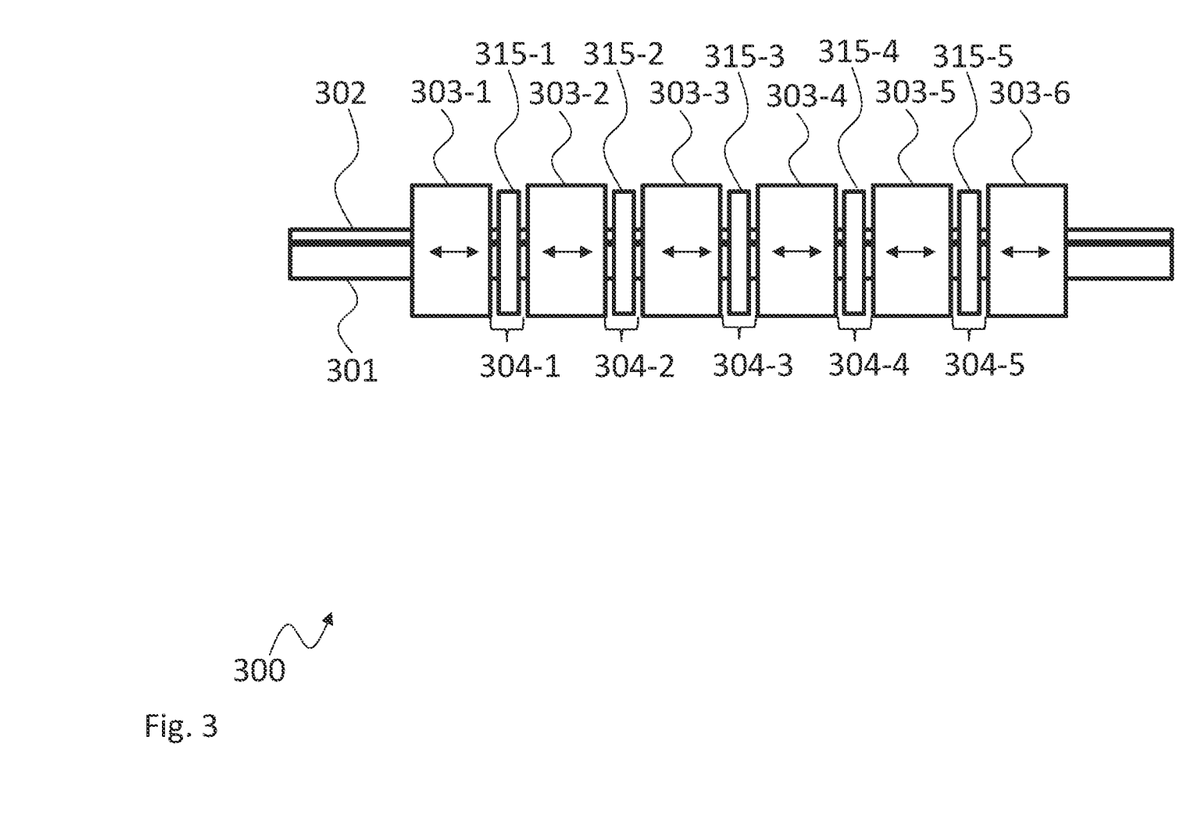
FIG. 3 shows a schematic view of an embodiment of another cable arrangement according to the present disclosure.

FIG. 3 shows another cable arrangement 300. The cable arrangement 300 is based on the cable arrangement 100. The cable arrangement 300 therefore comprises a cable 301 and a plastically deformable guiding element 302 that carry a number of magnetic elements 303-1-303-6.

Figure 5:
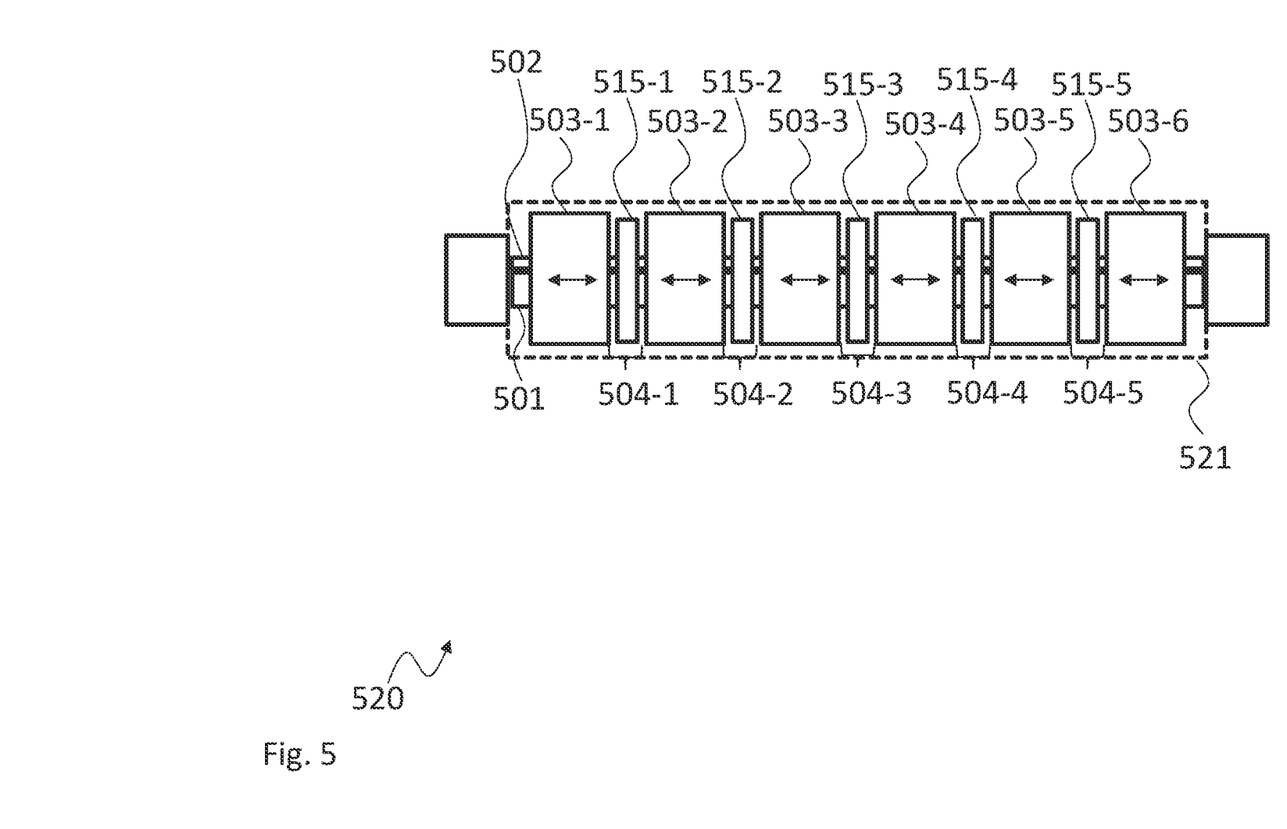
FIG. 5 shows a schematic view of an embodiment of a probe cable assembly according to the present disclosure.

Again, the cable arrangement 300 comprises six exemplary magnetic elements 303-1-303-6. It is understood, that the number of six magnetic elements 303-1-303-6 is just exemplarily chosen and that any other number of magnetic elements 303-1-303-6 may be provided. Further, the magnetic elements 303-1-303-6 may be provided over the full length of cable 301 or only on predetermined sections of the cable 301, and a cover sleeve as shown in FIG. 5 may optionally be provided that surrounds the magnetic elements 303-1-303-6. Of course such a cover sleeve may comprise rubber like or flexible material that allows bending the cover sleeve.

The information provided above with regard to the cable arrangement 100 also is applicable to the cable arrangement 300, where appropriate.

The magnetic elements 303-1-303-6 are distributed over the length of the shown section of the cable 301. Each one of the magnetic elements 303-1-303-6 is separated from adjacent magnetic elements 303-1-303-6 by a gap 304-1-304-5. In addition, in each one of the gaps 304-1-304-5 a low friction spacer 304-1-304-5 is provided. The low friction spacers 304-1-304-5 may for example be provided as Polytetrafluoroethylene or PTFE spacers. It is understood, that other adequate materials, especially non-flexible materials with a low friction coefficient, may also be used.

The low friction spacers 304-1-304-5 serve to separate and protect the magnetic elements 303-1-303-6 from touching each other, which might cause wear and damage to the magnetic elements 303-1-303-6.

As indicated above, the cable 301 and the plastically deformable guiding element 302 may move within the magnetic elements 303-1-303-6. The same applies to the low friction spacers 304-1-304-5. Bending of the cable arrangement 300 is, consequently, also possible with the low friction spacers 304-1-304-5 between the magnetic elements 303-1-303-6.

Figure 4:
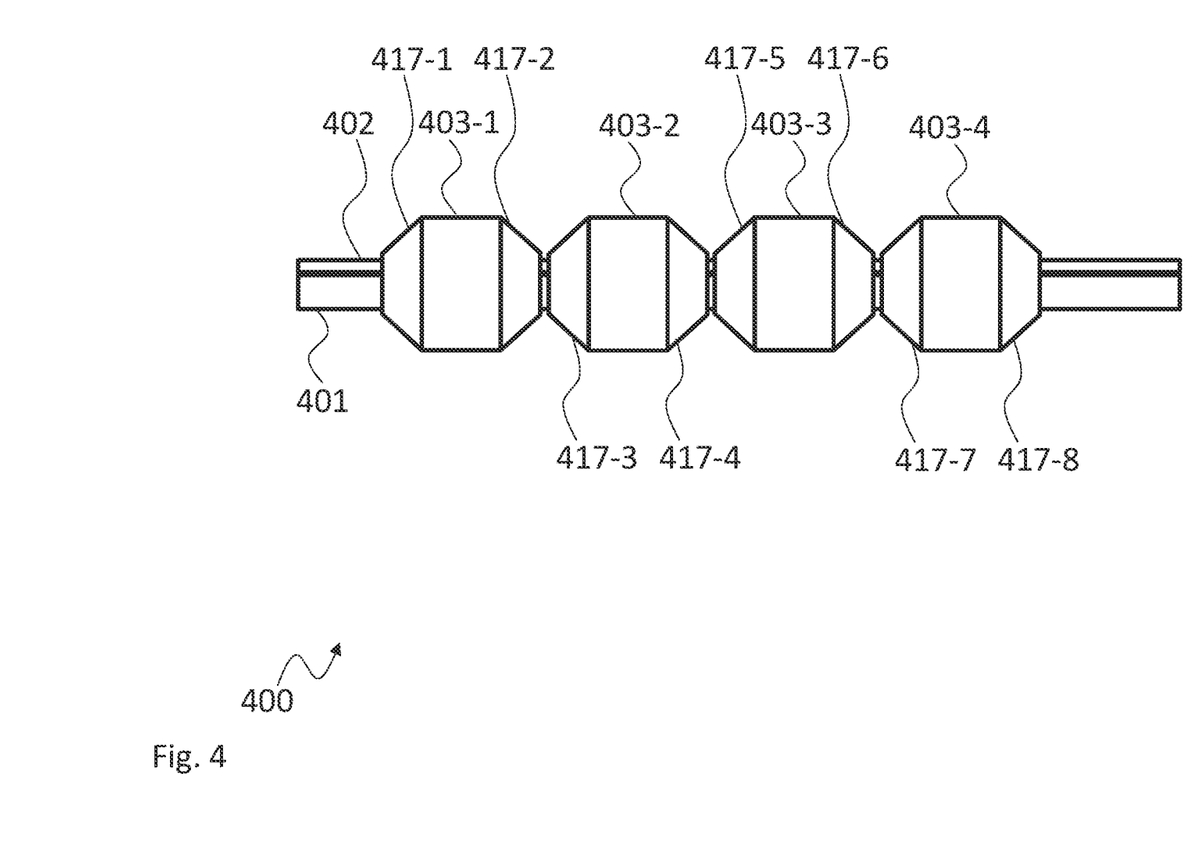
FIG. 4 shows a schematic view of an embodiment of another cable arrangement according to the present disclosure.

FIG. 4 shows another cable arrangement 400. The cable arrangement 400 is generally based on the cable arrangement 100. The cable arrangement 400, therefore, also comprises a cable 401 and a plastically deformable guiding element 402, and a plurality of magnetic elements 403-1-403-4 arranged on the cable 401 and the plastically deformable guiding element 402.

The cable arrangement 400 comprises four exemplary magnetic elements 403-1-403-4. It is understood, that the number of four magnetic elements 403-1-403-4 is just exemplarily chosen and that any other number of magnetic elements 403-1-403-4 may be provided. It is further understood, that the magnetic elements 403-1-403-4 may be provided over the full length of cable 401 or only on predetermined sections of the cable 401. As can be seen for example in FIG. 5, a cover sleeve may optionally be provided that surrounds the magnetic elements 403-1-403-4. Such a cover sleeve may also serve to hold the magnetic elements 403-1-103-4 in position relative to each other or on the cable 401. Of course such a cover sleeve may comprise rubber like or flexible material that allows bending the cover sleeve.

Instead of comprising cylindrical magnetic elements 403-1-403-4, the cable arrangement 400 comprises magnetic elements 403-1-403-4 that comprise a cylindrical center section and a conically shaped end 417-1-417-8 on each end of the cylindrical center section.

The conically shaped ends 417-1-417-8 allow placing the magnetic elements 403-1-403-4 without providing a gap between two of the magnetic elements 403-1-403-4 in each case, or with very small gaps, while preserving the bendability of the cable arrangement 400. The conically shaped ends 417-1-417-8 allow bending the cable arrangement 400 such that the outer surfaces of the two of the conically shaped ends 417-1-417-8 come closer to each other until the surfaces touch each other, even if no gap is provided between the magnetic elements 403-1-403-4.

The length of the cable 401 may therefore be fully covered with magnetic elements, or at least the size of the gaps may be reduced to a minimum that is required to provide bendability of the cable arrangement 400 and at the same time stability of the end surfaces of the conically shaped ends 417-1-417-8.

Of course, the low friction spacers mentioned above may also be provided between the magnetic elements 403-1-403-4 of the cable arrangement 400. In such an arrangement, the thickness of the low friction spacers may be reduced to the minimum required to provide the low friction spacers with the respective mechanical stability.

Of course, in embodiments, the magnetic elements 403-1-403-4 with the conically shaped ends 417-1-417-8 may be combined in a cable arrangement with the cylindrical magnetic elements as explained above.

FIG. 5 shows a probe cable assembly 520. The probe cable assembly 520 comprises a cable arrangement (not expressly referenced), for example a cable arrangement as shown in FIG. 3. Of course, any one of the cable arrangements provided in this disclosure may be used with the probe cable assembly 520.

The probe cable assembly 520 comprises a cable 501 and a plastically deformable guiding element 502 that carry a plurality of magnetic elements 503-1-503-6 with low friction spacers 515-1-515-5 between them. An optional cover sleeve 521 (indicated by a dotted line) may be provided to cover the cable 501, the plastically deformable guiding element 502, and the low friction spacers 515-1-515-5. At a first end, the cable 501 is electrically coupled to a probe interface 522. On the other end, the cable 501 is electrically coupled to a measurement output interface 523. Of course, the probe interface 522 and the measurement output interface 523 may also mechanical couple to and fix the cable 501.

As alternative to the cover sleeve 521, each one of the magnetic elements 503-1-503-6 may be coated with a respective cover material.

The cable arrangement 100 comprises six exemplary magnetic elements 503-1-503-6. It is understood, that the number of six magnetic elements 503-1-503-6 is just exemplarily chosen and that any other number of magnetic elements 503-1-503-6 may be provided. It is further understood, that the magnetic elements 503-1-503-6 may be provided over the full length of cable 501 or only on predetermined sections of the cable 501.

The probe interface 522 serves to couple the probe cable assembly 520 to a DUT either directly or indirectly. For directly coupling the probe cable assembly 520 to a DUT, the probe interface 522 may comprise respective electrical contacts.

If the probe interface 522 is to be coupled indirectly to the DUT, the probe interface 522 may comprise a respective connector, for example a BNC connector or any other adequate connector. Such a connector may be used to couple a measurement probe to the probe interface 522. The measurement probe may then be coupled to the DUT for measuring the respective signals.

Figure 6:
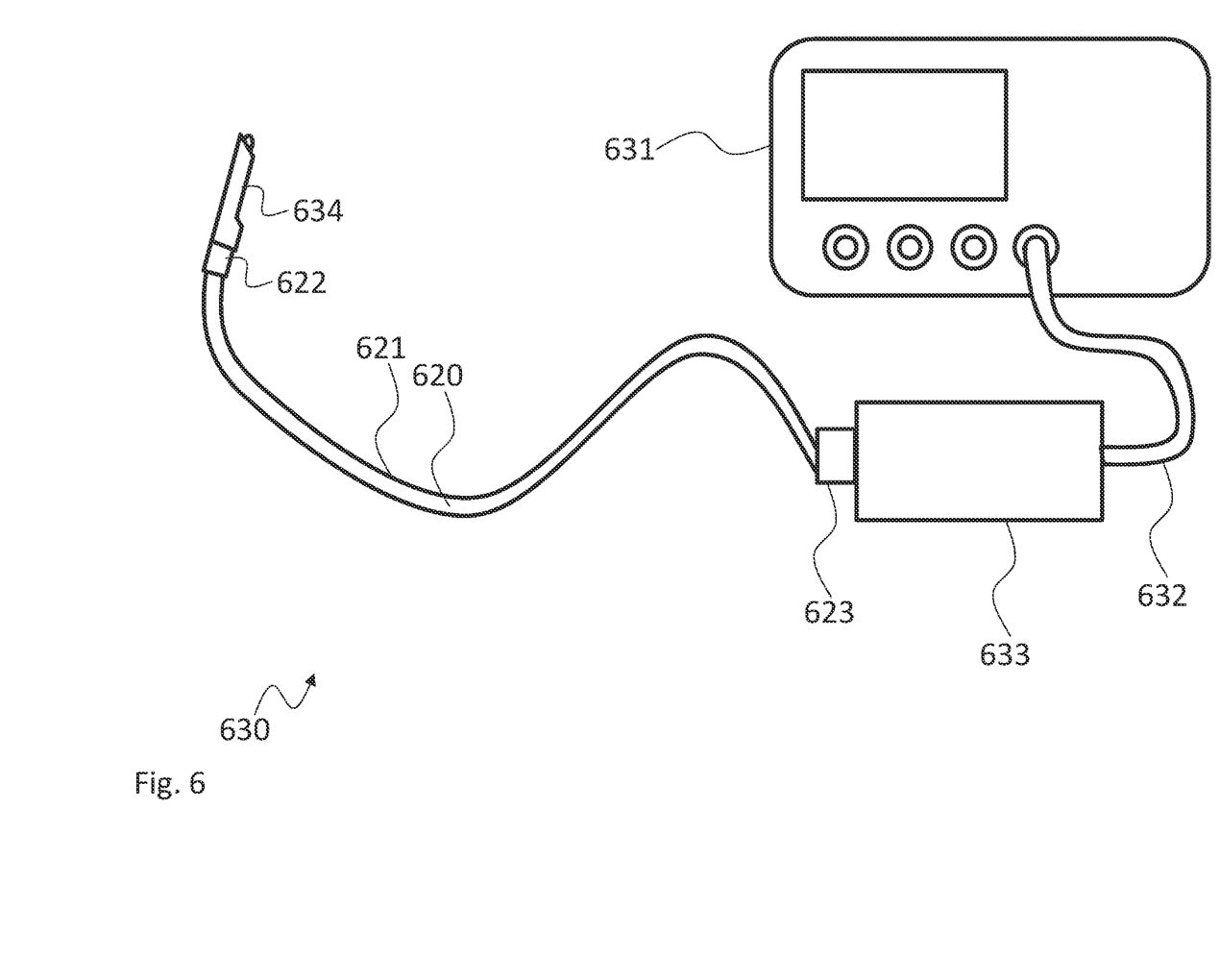
FIG. 6 shows a schematic view of an embodiment of a measurement system using an embodiment of a probe cable assembly according to the present disclosure.

The measurement output interface 523 serves to couple the probe cable assembly 520 to a measurement device, see for example FIG. 6. The measurement output interface 523 may be coupled directly to a measurement device and comprise a respective connector, for example a BNC connector or any other adequate type of connector. As alternative, the measurement output interface 523 may be coupled to a measurement device indirectly, for example via a an interposed device, like the above-mentioned probe box, between the measurement device and the measurement output interface 523. Such an interposed device may for example comprise filters, attenuators, or any other required electrical circuitry.

It is understood, that the probe interface 522 and the measurement output interface 523 may comprise active electronic elements or other electronic circuitry that may be required or advantageously used in the probe cable assembly 520, for example for performing signal conditioning tasks.

A probe cable assembly 520 as shown in FIG. 5 may be used to position the probe interface 522 and any possibly attached probe exactly where required in a measurement arrangement. The probe interface 522 will then remain at the intended position because the plastically deformable guiding element 502 will hold the probe cable assembly 520 in the intended shape until it is removed by a user.

FIG. 6 shows a measurement system 630 using a probe cable assembly 620 according to the present disclosure. The measurement system 630 comprises a measurement device 631, here an oscilloscope 631, that is coupled via connection cable 632 to a probe box 633. The probe box 633 is coupled to the measurement output interface 623 of a probe cable assembly 620. The probe interface 622 of the probe cable assembly 620 is coupled to a probe 634.

In embodiments, the measurement output interface 623 may be coupled directly to the measurement device 631, instead of the probe box 633. Further, more than one probe cable assembly 620 may be provided and may be coupled directly or indirectly to the measurement device 631.

The measurement system 630 may be used to measure signals, especially in surroundings that comprise common mode interference. Such surroundings may be provided for example in specific applications that require measuring RF signals while at the same time using high common mode voltages, like for example voltages of up to 60 kV or more.

Such measurement arrangements require a very high common mode rejection, to assure only the signal to be measured is provided to the measurement device 631 and no common mode overlay is measured in the measurement device 631.

The probe cable assembly 620 with the magnetic elements along the length of the cable that conducts the signals to be measured provides the required a high common mode rejection and therefore allows performing such measurements without measuring the unwanted common mode interference signals.

Usually, in applications with high common mode voltages during the measurement, the user is not present to hold the probe 634 in position. Consequently, with a flexibly probe cable, that allows bending the probe cable but does not hold the probe cable in position after it is bent accordingly, additional fixing means have to be provided to hold the probe cable and the probe in position.

In contrast, with the probe cable assembly 620 according to the present disclosure, the probe 634 is held in position after being positioned by a user automatically by the plastically deformable guiding element without the need to provide any additional fixing means to the probe.

Of course, the strength of the plastically deformable guiding element may be configured for example by dimensioning the thickness of a respective copper wire accordingly.

Although an oscilloscope 631 is shown in the measurement system 630, the measurement system 630 may also comprise any other type of measurement device, like for example vector network analyzers or the like.

Figure 7:
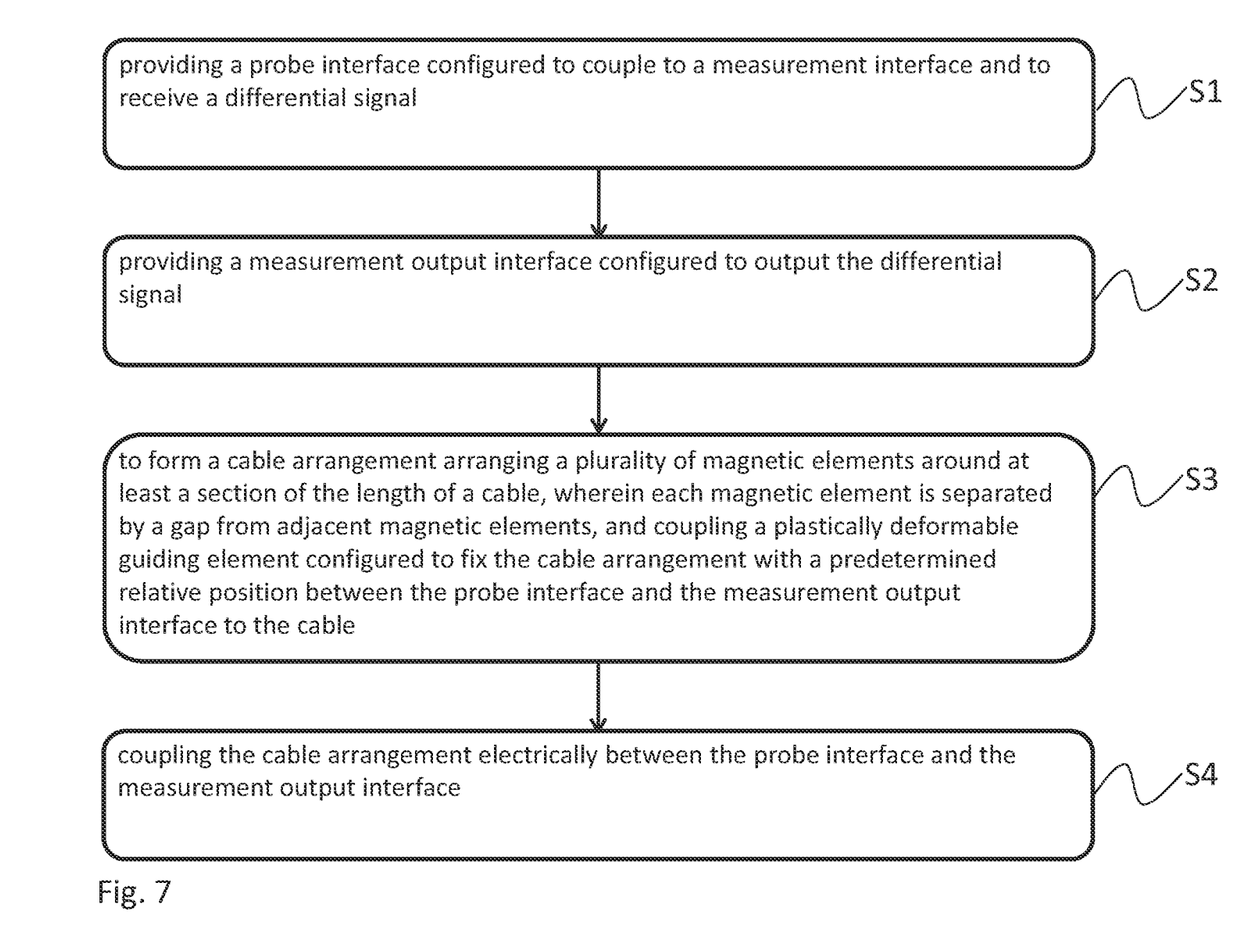
FIG. 7 shows a flow diagram of an embodiment of a method according to the present disclosure.

FIG. 7 shows a flow diagram of a method for manufacturing a probe cable assembly, for example any of the probe cable assemblies disclosed in the present disclosure.

The method comprises providing S1 a probe interface configured to couple to a measurement interface and to receive a differential signal, providing S2 a measurement output interface configured to output the differential signal. To form a cable arrangement the method comprises arranging S3 a plurality of magnetic elements around at least a section of the length of a cable, wherein each magnetic element is separated by a gap from adjacent magnetic elements, and coupling a plastically deformable guiding element configured to fix the cable arrangement with a predetermined relative position between the probe interface and the measurement output interface to the cable.

To form the probe cable assembly the cable arrangement is electrically coupled S4 between the probe interface and the measurement output interface.

The plastically deformable guiding element may for example be provided as a plastically deformable wire or rod. Alternatively, the plastically deformable guiding element may be provided with a plurality of stiff sections that are interconnected by joint arrangements.

The plastically deformable guiding element may be provided between the cable and the magnetic elements or on the outside of the magnetic elements. If a cover sleeve is provided around the magnetic elements, the plastically deformable guiding element may also be provided between the magnetic elements and the cover sleeve or in the cover sleeve or outside the cover sleeve.

The magnetic elements may be provided as Ferrites or ferrite elements, and may be movable along the length of the cable. In embodiments, the magnetic elements may be provided with a conically shaped end on each end in the direction of the cable.

Further, a low friction spacer may be provided in at least one of the gaps between the respective magnetic elements. The low friction spacers may comprise Polytetrafluoroethylene material.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS

100, 300, 400 cable arrangement
101, 301, 401, 501 cable
102, 202, 302, 402, 502 plastically deformable guiding element
103-1-103-6; 303-1-303-6 magnetic elements
403-1-403-4, 503-1-503-6 magnetic elements
104-1-104-5; 304-1-304-5 gap
504-1-504-5 gap
210-1-210-8 stiff section
211-1-211-7 joint arrangement
315-1-315-5, 515-1-515-5 low friction spacer
417-1-417-8 conically shaped end
520, 620 probe cable assembly
521, 621 cover sleeve
522, 622 probe interface
523, 623 measurement output interface
630 measurement system
631 measurement device
632 connection cable
633 probe box
634 probe
S1, S2, S3, S4 method steps

The invention claimed is:

1. A probe cable assembly comprising:
a probe interface configured to couple to a measurement interface and to receive a differential signal;
a measurement output interface configured to output the differential signal; and
a cable arrangement electrically arranged between the probe interface and the measurement output interface and configured to conduct the differential signal between the probe interface and the measurement output interface;
the cable arrangement comprising:
a cable;
a plurality of magnetic elements arranged around at least a section of the length of the cable, wherein each magnetic element is separated by a gap from adjacent magnetic elements;

a plastically deformable guiding element configured to fix the cable arrangement with a predetermined relative position between the probe interface and the measurement output interface.

2. The probe cable assembly according to claim 1, wherein the plastically deformable guiding element comprises a plastically deformable wire or rod.

3. The probe cable assembly according to claim 1, wherein the plastically deformable guiding element comprises a plurality of stiff sections that are interconnected by joint arrangements.

4. The probe cable assembly according to claim 1, wherein the plastically deformable guiding element is provided between the cable and the magnetic elements or on the outside of the magnetic elements.

5. The probe cable assembly according to claim 1, wherein the magnetic elements comprise ferrite elements.

6. The probe cable assembly according to claim 1, wherein the magnetic elements are movable along the length of the cable.

7. The probe cable assembly according to claim 1, wherein the magnetic elements comprise a conically shaped end on each end in the direction of the cable.

8. The probe cable assembly according to claim 1, wherein the cable arrangement comprises a low friction spacer arranged in at least one of the gaps.

9. The probe cable assembly according to claim 8, wherein the low friction spacer comprises Polytetrafluoroethylene material.

10. The probe cable assembly according to claim 1, wherein the cable comprises a coaxial cable comprising:
a signal conductor configured to conduct a signal of the differential signal;
an insulator surrounding the signal conductor; and
a reference conductor surrounding the insulator and configured to conduct a reference signal of the differential signal.

11. The probe cable assembly according to claim 10, wherein the signal conductor comprises a heatsealing band alloy comprising a NiCr alloy.

12. A method for manufacturing a probe cable assembly, the method comprising:
providing a probe interface configured to couple to a measurement interface and to receive a differential signal;
providing a measurement output interface configured to output the differential signal;
to form a cable arrangement, arranging a plurality of magnetic elements around at least a section of the length of a cable, wherein each magnetic element is separated by a gap from adjacent magnetic elements, and coupling a plastically deformable guiding element configured to fix the cable arrangement with a predetermined relative position between the probe interface and the measurement output interface to the cable; and
coupling the cable arrangement electrically between the probe interface and the measurement output interface.

13. The method according to claim 12, wherein the plastically deformable guiding element is provided as a plastically deformable wire or rod; or
wherein the plastically deformable guiding element is provided with a plurality of stiff sections that are interconnected by joint arrangements.

14. The method according to claim 12, wherein the plastically deformable guiding element is provided between the cable and the magnetic elements or on the outside of the magnetic elements.

15. The method according to claim 12, comprising providing a cover sleeve around the magnetic elements, wherein the plastically deformable guiding element is provided between the cable and the magnetic elements or between the magnetic elements and the cover sleeve or in the cover sleeve or outside the cover sleeve.

16. The method according to claim 12, wherein the magnetic elements are provided as ferrite elements.

17. The method according to claim 12, wherein the magnetic elements are movable along the length of the cable; or
wherein the magnetic elements are provided with a conically shaped end on each end in the direction of the cable.

18. The method according to claim 12, comprising providing a low friction spacer arranged in at least one of the gaps.

19. The method according to claim 18, wherein the low friction spacer comprises Polytetrafluoroethylene material.

20. A probe cable assembly comprising:
a probe interface configured to couple to a measurement interface and to receive a differential signal;
a measurement output interface configured to output the differential signal; and
a cable arrangement electrically arranged between the probe interface and the measurement output interface and configured to conduct the differential signal between the probe interface and the measurement output interface;
the cable arrangement comprising:
a cable;
a plurality of magnetic elements arranged around at least a section of the length of the cable, wherein each magnetic element is separated by a gap from adjacent magnetic elements,
a plastically deformable guiding element configured to fix the cable arrangement with a predetermined relative position between the probe interface and the measurement output interface; and
a cover sleeve provided around the magnetic elements, wherein the plastically deformable guiding element is provided between the cable and the magnetic elements or between the magnetic elements and the cover sleeve or in the cover sleeve.

* * * * *